United States Patent [19]

Berezin et al.

[11] 4,026,743
[45] May 31, 1977

[54] METHOD OF PREPARING TRANSPARENT ARTWORKS

[76] Inventors: Gennady Nikolaevich Berezin, 103479, korpus 905, kv. 135; Valery Nikolaevich Gurzheev, 103498, korpus 406, kv. 56; Vladimir Ivanovich Zakharov, 103498, korpus 440, kv. 188; Arkady Viktorovich Nikitin, 103498, korpus 447, kv. 61; Robert Arnoldovich Suris, Onezhskaya ulitsa, 53, korpus 1, kv. 105, all of Moscow, U.S.S.R.

[22] Filed: June 24, 1976

[21] Appl. No.: 699,439

[52] U.S. Cl. .................................. 156/653; 96/36; 96/38.3; 156/657; 156/659; 156/663
[51] Int. Cl.² ........................................ C03C 15/00
[58] Field of Search .............. 156/8, 11, 13, 15, 58, 156/59; 96/36, 38.1, 38.3; 356/161, 162, 209, 239

[56] References Cited

UNITED STATES PATENTS

| 3,370,948 | 2/1968 | Rosenbauer | 156/15 X |
| 3,428,503 | 2/1969 | Beckerle | 156/11 |
| 3,907,622 | 9/1975 | Otthofer | 156/11 X |

*Primary Examiner*—William A. Powell
*Attorney, Agent, or Firm*—Lackenbach, Lilling & Siegel

[57] ABSTRACT

A method of preparing transparent artworks by forming a predetermined topological relief pattern by way of local layer-by-layer removal of the material on the side of the masking layer which is translucent to actinic radiation, with concurrent measurement of the optical phase difference between actinic light rays passing through the masking layer and a substrate transparent to actinic light, until the geometrical relief of the pattern becomes deep enough to ensure the required optical phase difference which is a multiple of $2\pi$.

1 Claim, 7 Drawing Figures

METHOD OF PREPARING TRANSPARENT ARTWORKS

The present invention relates to the art of microelectronics, and more particularly to methods of preparing transparent artworks employed in photolithography with the purpose of making thin-film and integrated microcircuits through the use of planar techniques.

Widely known at present are at least two basic methods of preparing transparent artworks.

Each of these methods consists, primarily, of forming a masking layer translucent to actinic light in the near surface layer of a substrate transparent to actinic light, which is followed by creating a topological relief pattern in this layer.

According to the first of these two methods, the masking layer is formed in the surface portion of the substrate by tinting the surface of the substrate (glass blank) by electrodiffusion doping thereof with copper ions, followed by their reduction. The resulting thin masking layer is then removed wherever necessary by the photolithographic technique, through chemical or ionic etching, to provide for a predetermined topological relief pattern. Normally, the painted layer is etched prior to complete removal thereof, and the depth of the resulting geometrical relief corresponds to the thickness of the doped layer to produce what is known as diffusion artworks.

According to the other method, the masking layer is formed on the surface of the substrate (glass blank) by deposition thereon of a solid masking layer (more often than not, ferric oxides) of a thickness ensuring sufficient attenuation of actinic radiation. Then, just as according to the first method, the photolithographic technique is used to form a topological relief pattern with the masking layer being removed completely wherever necessary. The geometrical relief on an artwork of this type is determined by the thickness of the deposited masking layer.

Transparent artworks obtained by the above methods have a non-controllable and, in many cases, intolerably high level of diffraction distortion due to the geometrical relief not having a fixed size, the size being merely determined by the thickness of the masking layer. Since no stringent requirements are imposed, normally on the thickness of the masking layer, which parameter is defined but vaguely in the case of diffusion artworks, artworks of both types are characterized by their characteristic not being reproducible.

In addition, as will be shown herein below, a relief of an invariable but inadequately selected size will further raise the level of diffraction distortions, thus rendering the artworks useless.

Theoretical analysis of the conditions under which diffraction distortions occur makes it possible to establish the relationships of these effects and the optical characteristics of the artworks with a view to imposing such requirements thereto as to ensure a sufficiently low level of diffraction distortions in the course of their operation.

It is an object of the present invention to provide a method of preparing transparent artworks characterized by a low level of diffraction distortions (effects) and, hence, a wide range of operating exposures.

This object is attained by a method of preparing transparent artworks, which consists of forming a masking layer, translucent to actinic light, in the surface portion of a substrate transparent to actinic light to provide for a predetermined topological relief pattern, wherein, according to the invention, said relief pattern is achieved by way of local layer-by-layer removal of the material on the masking layer side with concurrent measurement of the optical phase difference between actinic light rays passing through the masking layer and transparent areas of the artwork, until the geometrical relief of the pattern becomes deep enough to ensure the required optical phase difference which should be a multiple of $2\pi$.

The proposed method ensures high stability of photolithography using transparent artworks, broadens the range of operating exposures, renders the optical density of masking coatings less critical, and provides for reproducibility of the optical characteristics of artworks.

The invention will now be described in greater detail with reference to specific embodiments thereof, taken in conjunction with the accompanying drawings, wherein.

Figure 1:
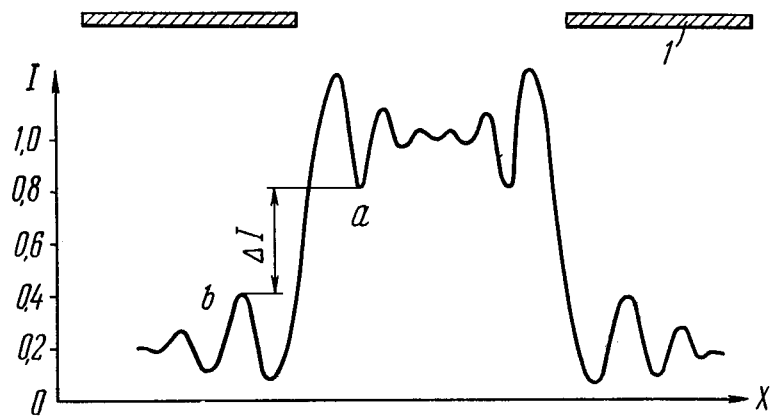
FIG. 1 shows a typical illumination intensity distribution provided for by a transparent strip on an artwork.

The proposed method of preparing transparent artworks consists of forming a masking layer, translucent to actinic light, in the near surface portion of a substrate transparent to actinic light (the substrate being normally a glass blank).

The masking layer can be formed in two ways. One way is to tint the substrate surface by electrodiffusion doping thereof with ions of copper, followed by their reduction. Artworks obtained as a result of tinting the masking layer will be hereinafter referred to as diffusion artworks. Alternatively, a solid masking layer (ferric oxides, normally) is deposited onto the substrate, the thickness of the masking layer being such as to provide for sufficient attenuation of actinic radiation.

Then, the photolithographic technique is used to produce a predetermined topological relief pattern in these layers. To this end, the material on the masking layer side is removed locally layer by layer by means of chemical or ionic etching. By "the material" is here meant either the masking layer itself or, if necessary, the glass substrate. Local layer-by-layer removal of the material is performed concurrently with measurement of the optical phase difference between actinic light rays passing through the masking layer and transparent areas of the artwork until the geometrical relief becomes deep enough to provide for the required optical phase difference which is a multiple of $2\pi$.

Artworks prepared by this method feature a low level of diffraction distortions, a wide range of operating exposures, a high stability to exposure and development errors as well as to uneven illumination of the operating field, and less stringent requirements to the optical density of the masking layers.

Since the proposed method is primarily aimed at minimizing diffraction effects, let us now consider these effects under conditions under which they occur and factors influencing them in greater detail.

As is well known (cf. G. N. Berezin, A. V. Nikitin and R. A. Suris, "Opticheskie printsipy formirovaniya izobrazheniya v kontaktnoy fotolitografii"/Optical Principles of Forming an Image in Contact Photolithography/, "Mikroelektronika" Publishers, edited by A. A. Vasenkov, vol. 8, 1975, p. 3), these effects are due, on the one hand, to such specific properties of the illuminating beam as its high coherence and sufficient monochromaticity and, on the other hand, to the gap between the contacting surfaces (in contact photolithography) or inadequate focusing of the artwork image onto the light receiving surface (working plate, in projection printing). Diffraction effects become particularly manifest in photolithography using transparent artworks, due to the translucency of their masking layers to actinic light. As a result, when the image is being transferred from a transparent artwork onto the photosensitive layer of the working plate, more often than not the image is split in the dark area (in case of overexposure) or bright area (in case of underexposure) to form what is known as the "double fringe". To avoid this "double fringe", exposure should be confined within a predetermined exposure range (cf. G. N. Berezin, A. V. Nikitin and R. A. Suris, "Difraktsiya na uglakh topologicheskikh figur"/Diffraction in the Corners of Topological Patterns/, "Elektronnaya tekhnika", Series 3, "Mikroelectronika" Publishers, vol. 4, 52, 1974) which is correlated with the operating intensity range (FIG. 1) and depends on the optical characteristics of the artwork.

FIG. 1 shows schematically the illumination distribution provided for by a transparent artwork, with the coordinate X in the plane of the light receiving surface being plotted on the abscissa, and the light intensity I at respective points being plotted on the ordinate. In this diagram, 1 denotes the masking layer, $a$ denotes the brightest point of the bright field, $b$ denotes the most illuminated point of the dark field, $\Delta I$ denotes the intensity difference between points $a$ and $b$, corresponding to the operating intensity range.

Kirchhoff's diffraction theory (cf. M. Born and E. Wolk Principles of Optics, Pergamon Press, 1968) permits calculation of the intensity distribution on the working plate depending on the optical characteristics of the artworks used as well as on the conditions of exposure.

It is also known (cf. G. N. Berezin A. V. Nikitin and R. A. Suris, "Opticheskie printsipy formirovaniya izobrazheniya v kontaktnoy fotolitografii", Microelectronics Publishers, ed. A.A. Vasenkov, vol. 8, 1975, p. 3) that the main optical characteristics of an artwork are contrast K and initial phase difference $\phi$. These parameters, together with the gap width, fully determine the diffraction pattern and, in particular, the operating intensity range (FIG. 2).

Figure 2:
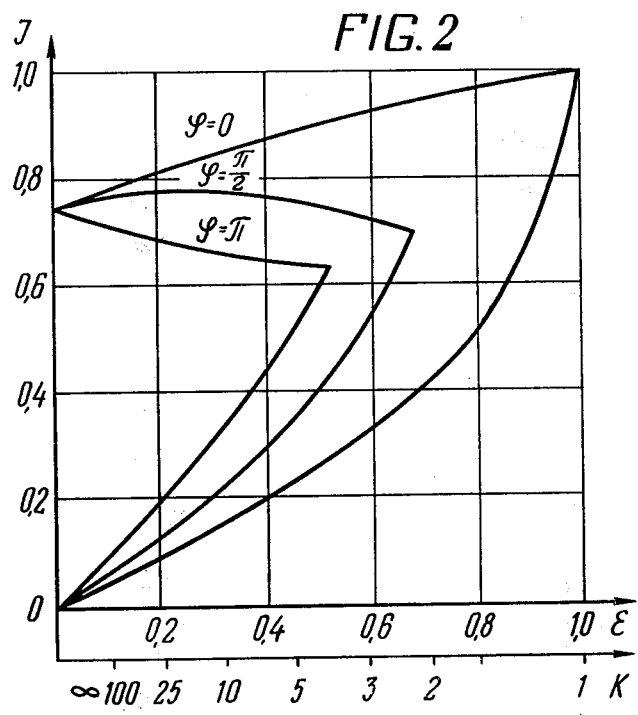
FIG. 2 is a diagram showing the operating intensity range versus the artwork characteristics and the contrast K for various values of the initial phase difference $\phi$.

Plotted as ordinates in FIG. 2 are the intensities I at characteristic points $a$ and $b$ of the diffraction pattern versus the contrast K or value $\epsilon = 1/\sqrt{K}$ plotted as abscissas. Here, the lower branches of the set of curves express in intensity-to-contrast relationship at the brightest points of the dark field (points $b$ in FIG. 1), while the upper branches of the curves express the intensity-to-contrast relationship at the least illuminated points of the bright field (points $a$ in FIG. 1). Each curve in FIG. 2 corresponds to a definite value of the phase difference $\phi$ shown in the diagram.

Thus, the difference in intensities as expressed by the upper and lower branches of the curves in each set defines the operating range for an artwork with preset values K and $\phi$. Analysis of the calculation results indicates that the widest operating range and, hence, the highest stability to diffraction distortions of the "double fringe" type, is featured by artworks with maximum K and minimum $\phi$.

High contrast K can be attained by forming a masking layer with high optical density in the actinic band of the spectrum. However, forming masking layers sufficiently transparent to visible light and practically impermeable to actinic light involves tremendous difficulties. At the same time, as can be seen from FIG. 2, artworks with $\phi = 0$ feature operating ranges wider than those of artworks with $\phi = \pi$ even if the contrast of the former is substantially lower.

Consider now specific examples of the initial phase difference influencing the width of the operating range.

Figure 3:
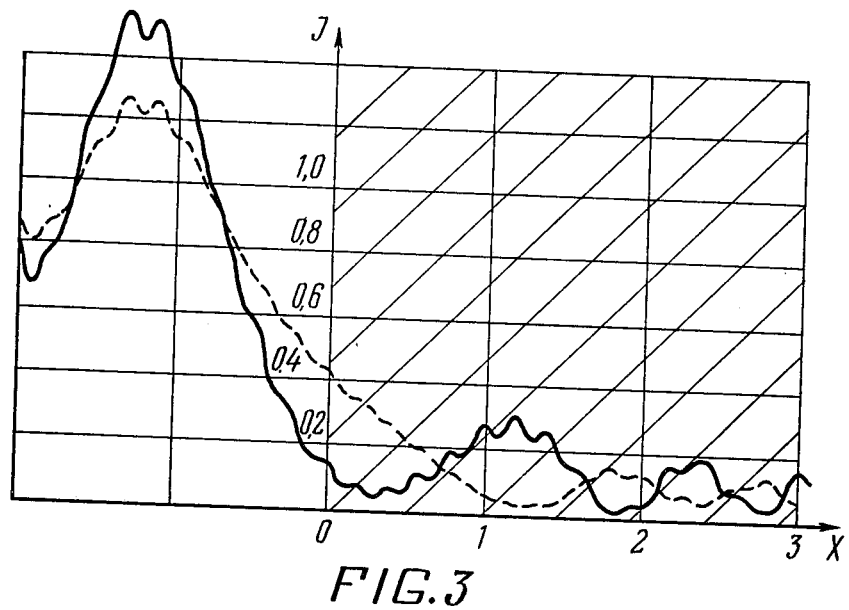
FIG. 3 shows the intensity distribution near the edge of a large topological element of a transparent artwork.

Shown in FIG. 3 are distributions of the intensities I, provided for by the opaque strip, at coordinate X on the plane of the light receiving surface which is at a distance Z = 5 microns from the artwork, for artworks with same contrast K = 11 but different initial phase differences $\phi$; $\phi = 0$ is shown by the broken curve and corresponds to an artwork prepared by the proposed method, and $\phi = \pi$ is the least adequate phase difference due to an improperly selected depth of the topological relief. The shaded area in FIG. 3 corresponds to the geometrical shadow cast by a topological element. In the case of $\phi = 0$, $\Delta I = 0.66$, and in the case of $\phi = \pi$, $\Delta I$ becomes as low as 0.38.

Figure 5:
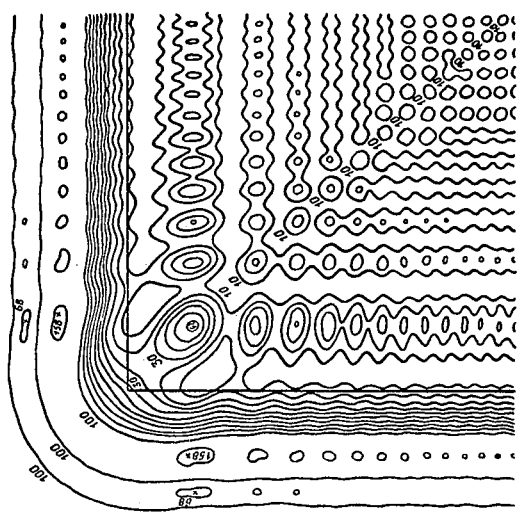
FIGS. 4 and 5 show the illumination intensity distribution at the masking angle of a transparent artwork with $K = 11$ and $\phi = 0$ and $\phi = \pi$, respectively.
Figure 4:
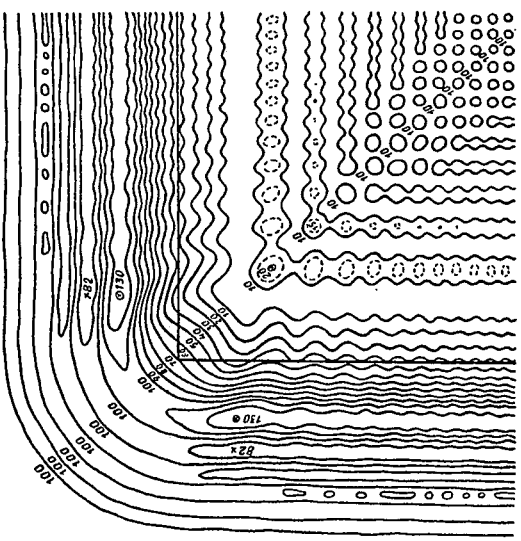

The influence of the initial phase difference becomes still more manifest when comparison is made of intensity distributions at the masking angles of transparent artworks with $\phi = 0$ and $\phi = \pi$ (FIGS. 4 and 5, respectively).

FIGS. 4 and 5 show two-dimensional number fields representative of diffraction distributions of illumination intensities at the masking angles of transparent artworks with $\phi = 0$ and $\phi = \pi$. Points with equal illumination in intensity are joined by solid lines, isoluxes, with figures indicating the level of illumination in percentage to the illumination intensity of the bright field at points remote from its boundaries. The thick solid line denotes the boundaries of the geometrical shadow of the masking angle. In this case, $\Delta I = 0.61$ for $\phi = 0$ and becomes infinitesimal ($\Delta I = 0.06$) for $\phi = \pi$.

It becomes evident from FIGS. 2 – 5 that artworks with $\phi \approx 0$ are much more advantageous. Such artworks exhibit a substantially wider operating exposure range than those with different values of $\phi$ even at much lower values of the contrast K.

Figure 6:
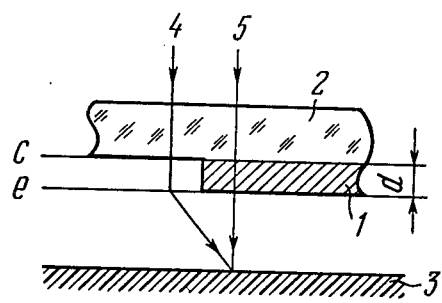
FIG. 6 shows schematically the initial stage of dephasing when actinic light passes through a transparent artwork.

The mechanism of the initial stage of the phase difference $\phi$ is explained by FIG. 6.

In FIG. 6, 2 denotes the glass substrate (blank) of the artwork and 3 denotes the light receiving surface, e.g. photoresist layer, photoemulsion.

What follows now is a simplified but sufficiently elucidative description of the initial phase difference. Let us assume that the initial phase difference is due, exclusively, to the relief formed as a result of removal of the masking layer. Two rays 4 and 5 of actinic light with a wavelength of $\lambda_o$ in a vacuum pass through the glass substrate of the artwork and reach a plane $c$ with $\phi_1 = \phi_2$. Beyond that plane, however, the ray 5 continues passing through glass where it is characterized by the wavelength $\lambda_{o/n}$ (where $n$ is the refractive index of the masking layer for a given wavelength), while the ray 4 passes on through air where its wavelength remains equal to $\lambda_o$. As a result, both rays reach a plane $e$ with a phase difference $\phi$ depending on the length of their optical path through the different media, i.e. on the depth $d$ of the geometrical relief. Quantitatively, this relationship can be expressed as follows:

$$\phi = 2\pi/\lambda_o \int_o^d [n(x) - 1] dx \quad (1)$$

Obviously, in the case of the refractive index $n$ being constant throughout the entire masking layer, formula (1) takes the form:

$$\phi = \frac{2\pi (n - 1) d}{\lambda_o} \quad (2)$$

The proposed method makes use of the fact that artworks with the initial phase difference $\phi$ being a multiple of $2\pi$, i.e. $\phi = 2\pi, 4\pi, 6\pi$, etc., are optically similar to flat artworks (without relief). As can be seen from expressions (1) and (2), the required phase difference, $\phi = 2\pi, 4\pi$, etc., can be attained by controlled removal of the material of the masking layer (and the substrate) until a predetermined depth is reached. These formulas can also be used for calculating this depth.

The geometrical relief obtained while forming a pattern on the masking layer should have such a depth as to ensure an optical phase difference between actinic light rays passing through the masking layer and transparent areas of the artwork, which is a multiple of $2\pi$.

The proposed method will now be illustrated by examples of its realization. The techniques of preparing artworks will be omitted for they have been described in detail hereinabove.

EXAMPLE 1

In the case of a transparent artwork prepared by the method of pyrolitic deposition of ferric oxides onto the glass substrate of the masking layer, to a thickness of about 800A, which are then totally removed while forming the pattern, the initial phase difference $\phi$ on the relief obtained in this manner will therefore be:

$$\phi = \frac{2\pi (4 - 1) \cdot 0,08}{0,4} = 1,2\pi$$

Such an artwork cannot work because its operating exposure range is too narrow (in the order of few percent and, taking into account exposure errors, uneven illumination of the operating field and development errors, will systematically produce poor prints. To prepare a workable artwork based on a ferric-oxide masking layer, either the thickness of this layer should be increased to 1,330 A (in which case $\phi = 2\pi$), or, if the layer has already been deposited to a thickness of 800 A, the transparent portions in the "windows" of the masking layer should be etched further to a depth ensuring an additional phase difference equal to $0.8\pi$ to give a total of $\phi = 2\pi$.

EXAMPLE 2

The thickness of the Si layer on artworks with a silicon layer can be easily calculated to provide for $\phi = 2\pi$. From formula (2) we can write:

$$d = \frac{\phi \cdot \lambda_o}{2\pi (n - 1)} = \frac{2\pi \cdot 0,4 \cdot 10^4}{2\pi (4,5 - 1)} = 1150° A$$

EXAMPLE 3

It is more difficult to calculate the depth of a relief providing for $\phi = 2\pi$ in the case of an artwork with a diffusion masking layer because, strictly speaking, here $n = n = (x)$ while the relationship between the refractive index and depth is, as a rule, not known in advance. Nevertheless, by selecting an average effective refractive index for the entire layer, one can estimate the required depth of the pattern relief. Thus, for an artwork whose masking layer has been obtained by electrodiffusion of copper from lead and bismuth dopants with subsequent reduction of copper ions in glass the refractive index $n$ may be approximately equal to 2.1 to 2.5. Assuming that the refractive index is constant and equal to 2.5 in the tinted layer, we find the desired etching depth:

$$d = \frac{0.4}{2.5 - 1} = 0.27 \text{ microns.}$$

Optical measurement of the initial phase difference on the relief of such an artwork indicates that $\phi$ actually equals 2. For different batches of glass with diffusion tinting the etching depth ensuring that $\phi = 2\pi$ was within the range of 0.25 to 0.3 microns.

EXAMPLE 4

The required etching depth can be precalculated and determined precisely by way of layer-by-layer removal of the masking layer and, if necessary, the transparent substrate of the artwork (FIG. 7) concurrently with measuring the phase difference with the aid of, for example, a Jamin refractometer.

Figure 7:
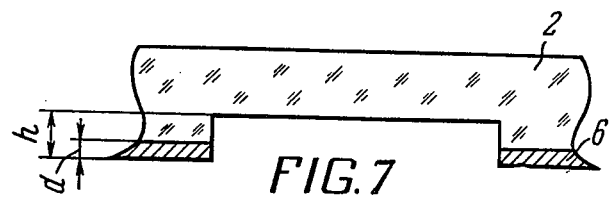
FIG. 7 is a cross-sectional view of an artwork prepared by the method of the present invention.

FIG. 7 shows an embodiment of an artwork, prepared by the proposed method with $\phi = 2\pi$, comprising a masking layer 6 having a thickness $d$. The required phase difference $\phi = 2\pi$ is achieved by additionally removing the material of the substrate 2 to a thickness $h-d$, where $h$ is the depth of the geometrical relief.

Thus, artworks prepared by the method according to the invention and as illustrated in Examples 1 to 4 are characterized by a reproducible and low level of diffraction distortion, a wide operating range of permissible exposures, and high quality of prints made by using these artworks. Experience in using diffusion artworks with K = 20 to 25, prepared according to Example 3 with $\phi = 2\pi$, indicates that they ensure high-quality photolithography of topological patterns with a minimum size of 2 microns. A two- or three-fold underexposure or overexposure does not bring about a "double-fringe".

What is claimed is:

1. A method of preparing transparent artworks comprising the following steps:
    taking a substrate transparent to actinic light;
    forming, in the near surface portion of said substrate, a masking layer translucent to said actinic light; and making a predetermined topological relief pattern by way of local layer-to-layer removal of the material on the side of said masking layer with concurrent measurement of the optical phase difference between actinic light rays passing through said masking layer and transparent portion of said artwork, until the geometrical relief of said pattern becomes deep enough to ensure said optical phase difference which is a multiple of $2\pi$.

* * * * *